(12) United States Patent
Altman et al.

(10) Patent No.: US 8,809,208 B2
(45) Date of Patent: Aug. 19, 2014

(54) NANO-TUBE THERMAL INTERFACE STRUCTURE

(75) Inventors: David H. Altman, Framingham, MA (US); Erik F. Nordhausen, Littleton, MA (US); Steven D. Bernstein, Brighton, MA (US); Robert P. Molfino, Clinton, MA (US); Steven B. Wakefield, Billerica, MA (US)

(73) Assignee: Raytheon Company, Waltham, MA (US)

( * ) Notice: Subject to any disclaimer, the term of this patent is extended or adjusted under 35 U.S.C. 154(b) by 210 days.

(21) Appl. No.: 13/338,303

(22) Filed: Dec. 28, 2011

(65) Prior Publication Data

US 2012/0094484 A1    Apr. 19, 2012

Related U.S. Application Data

(62) Division of application No. 12/535,295, filed on Aug. 4, 2009, now Pat. No. 8,106,510.

(51) Int. Cl.
*H01L 21/00* (2006.01)
*H01L 21/20* (2006.01)
*H01L 23/373* (2006.01)

(52) U.S. Cl.
CPC .......... *H01L 23/373* (2013.01); *H01L 23/3733* (2013.01); *H01L 23/3737* (2013.01)
USPC ........... 438/795; 438/584; 438/122; 428/323; 428/367; 428/378; 428/389

(58) Field of Classification Search
CPC .............. H01L 23/373; H01L 23/3733; H01L 23/3737; F28F 13/185
USPC ................... 361/709; 438/795; 257/E21.506; 977/762
See application file for complete search history.

(56) References Cited

U.S. PATENT DOCUMENTS

| 6,340,822 | B1 | 1/2002 | Brown et al. |
| 7,316,061 | B2 | 1/2008 | Dubin et al. |

(Continued)

FOREIGN PATENT DOCUMENTS

| EP | 2104141 A2 | 9/2009 |
| EP | 2104141 A3 | 9/2009 |

(Continued)

OTHER PUBLICATIONS

Notification of Transmittal of the International Search Report and the Written Opinion of the International Searching Authority, or the Declaration, PCT/US2010/043455 date of mailing Nov. 30, 2010, 6 pages.

(Continued)

*Primary Examiner* — Chuong A Luu
*Assistant Examiner* — Cory Eskridge
(74) *Attorney, Agent, or Firm* — Daly, Crowley, Mofford & Durkee, LLP

(57) ABSTRACT

A structure, comprising: a semiconductor structure having an electrically and thermally conductive layer disposed on one surface of the semiconductor structure; an electrically and thermally conductive heat sink; a electrically and thermally conductive carrier layer; a plurality of electrically and thermally nano-tubes, a first portion of the plurality of nano-tubes having proximal ends disposed on a first surface of the carrier layer and a second portion of the plurality of nano-tubes having proximal ends disposed on an opposite surface of the carrier layer; and a plurality of electrically and thermally conductive heat conductive tips disposed on distal ends of the plurality of nano-tubes, the plurality of heat conductive tips on the first portion of the plurality of nano-tubes being attached to the conductive layer, the plurality of heat conductive tips on the second portion of the plurality of nano-tubes being attached to the heat sink.

3 Claims, 3 Drawing Sheets

(56) References Cited

U.S. PATENT DOCUMENTS

| | | | |
|---|---|---|---|
| 2002/0100581 A1 | 8/2002 | Knowles et al. | |
| 2006/0231946 A1* | 10/2006 | Pan et al. | 257/712 |
| 2008/0074847 A1 | 3/2008 | Sueoka et al. | |
| 2008/0236804 A1* | 10/2008 | Cola et al. | 165/185 |
| 2008/0283269 A1 | 11/2008 | Graham, Jr. et al. | |

FOREIGN PATENT DOCUMENTS

| | | |
|---|---|---|
| EP | 2187440 A2 | 5/2010 |
| EP | 2187440 A3 | 5/2010 |
| WO | WO2006/043974 A2 | 4/2006 |
| WO | WO2006/043974 A3 | 4/2006 |

OTHER PUBLICATIONS

Written Opinion of the International Searching Authority, or the Declaration, PCT/US2010/043455 date of mailing Nov. 30, 2010, 11 pages.

Cola et al., "Increased Real Contact in Thermal Interfaces: A Carbon Nanotube/Foil Material", Applied Physics Letters, vol. 90, No. 9, 093513, Feb. 26, 2007, pp. 09351-1-09351-3, XP002608370, DOI: 10.1063/1.2710743.

Sample et al., "Carbon Nanotube Coatings for Thermal Control", The Ninth Intersociety Conference on Thermal and Thermomechanical Phenomena in Electronic Systems, 2004. ITHERM '04, vol. 1, Jul. 1, 2004, pp. 297-301, XP002608386, DOI: 10.1109/ITHERM.2004.1319188, ISBN: 0-7803-8357-5.

RD Johnson, DF Bahr, CD Richards, RF Richards, D Mcclain, J Green and J Jiao, Thermocompression Bonding of Vertically Aligned Carbon Nanotube turfs to metalized substrates, IOP Publishing, 2009, pp. 1-6.

Tao Tong, Arun Majumdar, Yang Zhao, Ali Kashani, Lance Delzeit, M. Meyyappan, Indium Assisted Multiwalled Carbon Nanotube Array Thermal Interface Materials, IEEE, 2006, pp. 1406-1411.

Lingbo Zhu, Dennis W. Hess, C.P. Wong, Assembling Carbon Nanotube Films as Thermal Interface Materials, IEEE, 2007, pp. 2006-2010.

\* cited by examiner

NANO-TUBE THERMAL INTERFACE STRUCTURE

RELATED APPLICATIONS

This application is a divisional application of U.S. patent application Ser. No. 12/535,295 entitled NANO-TUBE THERMAL INTERFACE STRUCTURE filed on Aug. 4, 2009, which is incorporated herein by reference in its entirety.

TECHNICAL FIELD

This disclosure relates generally to thermal interface structures and more particularly to nano-tube thermal interface structures.

BACKGROUND

As is known in the art, in many applications it is necessary to remove heat from, for example, microelectronic components such as semiconductor integrated circuit chips. One heat removal or, more generally, thermal management technique, includes the use of a thermal interface structure disposed between the integrated circuit chip and a heat sink.

As is also known in the art, the trend of increasing power density in microelectronic components has accelerated the need for improved thermal management techniques. With heat fluxes ranging from 0.1-3 kW/cm2 being expected in next generation silicon and wide band gap semiconductor electronics, reducing thermal resistances across interfaces has become crucial in reducing device operational temperature and ensuring reliability. This research challenge has led to the development of new thermal interface materials along with advanced heat spreaders (e.g., diamond, AlN, etc.) in order to effectively manage heat dissipation requirements. At present, the highest performing thermal interface materials commercially used are in the form of solder die attach films. These films have thermal conductivities which range from 20-86 W/mK. However, they are susceptible to thermal fatigue and aging, are not always easily reworkable, and may transfer large stresses to the die which limits die thinning concepts.

Multiple approaches and various technologies have been evaluated to enhance thermal transport across interfaces in past research efforts. Although extensive experimental work has been conducted on different epoxy filler materials (i.e. silver, diamond, Carbon Nano-Tube (CNT), carbon fiber, see U.S. Pat. No. 7,316,661, issued Jan. 8, 2008), as well as the size, shape, and volume concentration of filler, there has been very little effort towards the creation of alternative approaches to filled epoxies. Most prior experimental work focused on improving bulk thermal conductance and was guided by percolation theory. The current thrust across the industry is to understand interfacial resistance at joints, and the reason for the dramatic reduction in performance that these interfaces pose. Improved understanding of thermal energy transport at nanometer scales in recent years has enabled a broad range of technological advances.

More particularly, extensive experimental work has been conducted on particle filled materials (e.g. silver, diamond, CNT and carbon fiber), low-temp solders and vertically aligned nanostructures. Most prior experimental work was focused on improving bulk thermal conductance (see E. E. Marotta and L. S. Fletcher, "Thermal contact conductance of selected polymeric materials," J. Thermophys. Heat Transf., vol. 10, no. 2, pp. 334-342, 1996) and was driven by percolation theory or involved direct growth of CNTs/Carbon Nano Fibers (CNF) on device substrates. The current thrust across the industry is to understand interfacial resistance at joints, and the reason for the dramatic reduction in performance that these interfaces pose (see E. E. Marotta and L. S. Fletcher, "Thermal contact conductance of selected polymeric materials," J. Thermophys. Heat Transf., vol. 10, no. 2, pp. 334-342, 1996).

Vertically aligned CNTs are well documented as providing exceptional on-axis thermal conductivity (see D. E. Angelescu, M. C. Cross, and M. L. Roukes, "Heat Transport in Mesoscopic Systems," Superlatices and Microstructures, vol. 23, p. 673, 1998); however, both multi-(MW) and single-walled (SW) CNTs have yet to reach their potential in interface applications. While possessing greater theoretical conductivity, SWCNTs are problematic in vertically aligned array interface applications as their diameters (1-2 nm) (see J. M. Ziman, Electrons and phonons: the theory of transport phenomena in solids. Oxford: Clarendon Press, 1962) are smaller than the dominant phonon wavelength in most growth substrates (~5 nm) (see M. S. Dresselhaus, G. Dresselhaus, and P. C. Eklund, Science of Fullerenes and Carbon Nanotubes. SanDiego, Calif.: Academic Press, 1996), resulting in scale-mismatch induced reflection that increases interfacial resistance. Some MWCNT approaches have utilized polymer (see R. Prasher, "Thermal interface materials: Historical perspective, status, and future directions," Proceedings of the Ieee, vol. 94, pp. 1571-1586, August 2006) or metal fillers (Chuang, H. F. et al., "Improvement of Thermal Contact Resistance by Carbon Nanotubes and Nanofibers," Journal of Nanoscience and Nanotechnology, Vol 4, no. 8, pp. 964-967, 2004) to provide mechanical stability and adhesion. Elastic medium interference with phonon dispersion and lack of compliance to micro-scale surface roughness present in real substrates has limited the efficacy of these approaches. Recently, double sided CNT-foil gaskets synthesized at Purdue have exhibited promise as interface materials for micro-rough surfaces, exhibiting resistances of ~10 $mm^2K/W$ (see B. A. Cola, X. Xu, T. S. Fisher, Applied Physics Letters 2007, 90, 093513) under moderate pressures.

In related work, CNT free-end contact resistance has been shown to comprise ~90% of the overall resistance in Cu-CNT-Si interfaces (see J. Xu and T. S. Fisher, "Enhancement of thermal interface materials with carbon nanotube arrays," International Journal of Heat and Mass Transfer, vol. 49, pp. 1658-1666, May 2006). Metallic bonding of CNT free-ends using Indium solders (see T. Tong, A. Majumdar, Y. Zhao, A. Kashani, "Indium Assisted Multiwalled Carbon Nanotube Array Thermal Interface Materials" 2006 IEEE proceedings) has been shown to reduce thermal resistance an order of magnitude vs. a dry interface.

To be an effective alternative to the presently employed thermal epoxies an alternative Thermal Interface Materials (TIM) solution for high-power electronic devices must not require modification to the device or heat sink, be compatible with device metallization schemes, allow factory rework, allow for some degree of heat sink roughness and absorb coefficient of thermal expansion (CTE) mismatch between the device and heat sink so not to generate stress.

SUMMARY

In accordance with the present disclosure, a structure is provided comprising: a semiconductor structure having an electrically and thermally conductive layer disposed on one surface of the semiconductor structure; an electrically and thermally conductive carrier layer; a plurality of electrically and thermally conductive nano-tubes having proximal ends disposed on the carrier layer; and a plurality of electrically and thermally heat conductive tips disposed on distal ends of the nano-tubes, the plurality heat conductive tips being attached to the conductive layer.

In one embodiment, the plurality heat conductive tips are bonded to the conductive layer.

In one embodiment, the plurality heat conductive tips are thermo-compression bonded to the conductive layer.

In one embodiment the tips have a metal coating.

In one embodiment, the tubes are hollow.

In one embodiment, the carrier layer is graphene.

In one embodiment, the carrier layer is metal

In one embodiment, a structure is provided, comprising: a semiconductor structure having an electrically and thermally conductive layer disposed on one surface of the semiconductor structure; an electrically and thermally conductive heat sink; a electrically and thermally conductive carrier layer; a plurality of electrically and thermally nano-tubes, a first portion of the plurality of nano-tubes having proximal ends disposed on a first surface of the carrier layer and a second portion of the plurality of nano-tubes having proximal ends disposed on an opposite surface of the carrier layer; and a plurality of electrically and thermally heat conductive tips disposed on distal ends of the plurality of nano-tubes, the plurality of heat conductive tips on the first portion of the plurality of nano-tubes being bonded to the conductive layer, the plurality of heat conductive tips on the second portion of the plurality of nano-tubes being bonded to the heat sink.

In one embodiment, a method is for forming a structure. The method comprises: providing a semiconductor structure having an electrically and thermally conductive layer disposed on one surface of the semiconductor structure; providing an electrically and thermally conductive heat sink; and providing a unit comprising: a electrically and thermally carrier layer; a plurality of electrically and thermally conductive nano-tubes, a first portion of the plurality of nano-tubes having proximal ends disposed on a first surface of the carrier layer and a second portion of the plurality of nano-tubes having proximal ends disposed on an opposite surface of the carrier layer; a plurality of heat conductive tips disposed on distal ends of the plurality of nano-tubes. The method provides a sandwich structure comprising the provided unit disposed between the provided heat sink and provided semiconductor structure with the plurality of heat conductive tips on the first portion of the plurality of nano-tubes positioned in contact with the conductive layer and with the plurality of heat conductive tips on the second portion of the plurality of nano-tubes being positioned in contact with the heat sink. The method applies heat and pressures to the sandwich structure to simultaneously bond: (1) the plurality of heat conductive tips on the first portion of the plurality of nano-tubes to the conductive layer; and (2) the plurality of heat conductive tips on the second portion of the plurality of nano-tubes to the heat sink.

The process flow can be broken down into three major steps: CNT growth on a thermally conductive carrier layer (foil), CNT end-metallization, and low temperature metal bonding. The foil carrier layer provides high lateral spreading to overcome the poor in plane conductivity and CNT free-end utilization that has previously prevented CNTs from achieving their full potential. By applying thin metallization to just the tips of the individual CNTs we leverage the proven advantages of metallic bonding for robust and reworkable assemblies. Additionally, by developing and utilizing innovative techniques for reduction of interfacial resistance, we limit thermal losses across boundaries.

With such structure and method, the following are achieved:

1. Low-temp layered metallic bonding materials are used for stability, strength and low joint thermal resistance 2. Vertically aligned CNT-foil carriers are used to achieve compliance and lateral spreading, mitigating device hot-spots and non-contacting CNTs.

3. CNT-foil structures are sandwiched between the semiconductor and heat sink to minimize application time and maximize reworkability With such an arrangement, a Nano-Thermal Interface Material (nTIM) uses metallic bonding materials to attach high-performance Carbon Nano-Tube (CNT)-foil carriers to device and heat sink interfaces. This minimizes joint resistances through optimization of thin metallic bonds and multi-walled carbon nanotube (MWCNT) arrays grown on foils, providing a "drop-in" TIM solution that does not require modification to either the semiconductor device or heat sink. The CNT-foil interposers comply with micro-rough heat sink surfaces through both foil and CNT deformation. This removes constraints on the CNT arrays, allowing maximum performance. Interfacial resistance is further minimized through maximum utilization of bonded CNT free-ends and efficient flux distribution afforded through lateral spreading in the foil. Thin, stable metallic bonding materials such as Au are used to maximize stability and minimize application temperature and pressure. Bond thickness is minimized through metallization of CNT tips prior to bonding via electron beam evaporation. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1:
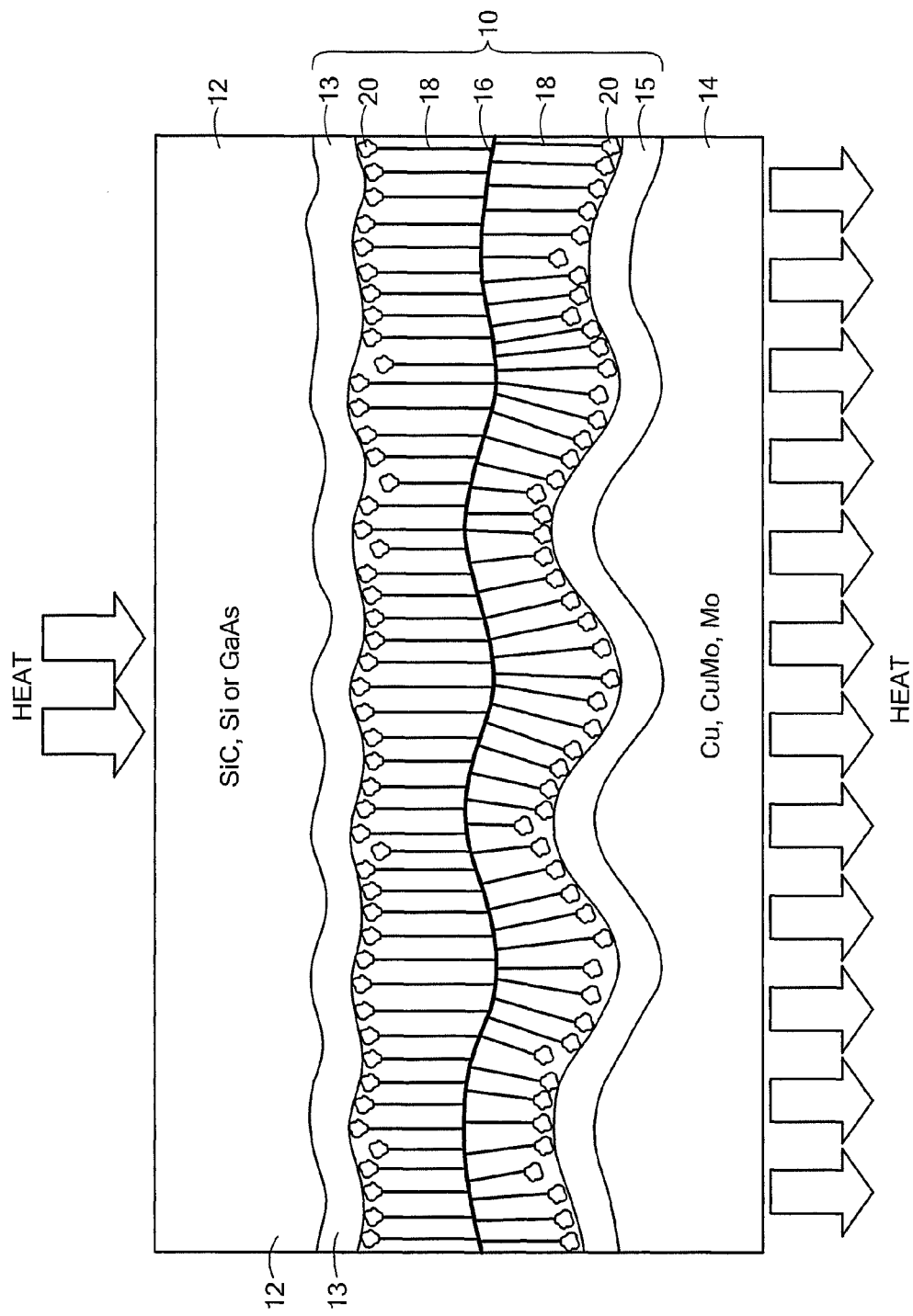
FIG. 1 is a sketch of a structure used to transport heat generated in a heat source to a heat sink and also to provide electrical continuity between the heat sources to the heat sink as needed when the heat source is an integrated circuit according to the disclosure.

Referring to FIG. 1, a structure 10 is used to transport heat generated in a heat source 12, here a monolithic microwave integrated circuit (MMIC) 12 having a metal ground plane conductor layer 13, here a thermally and electrically conductive material such as, for example, Ti/Au or W/Au, on the bottom surface of the chip 12 to a conductive layer 15, here for example, of the same material as the layer 13, on the upper surface of a heat sink 14. The structure 10 includes a electrically and thermally conductive carrier layer 16 having high lateral thermal spreading properties (such as copper or aluminum; here preferably graphene or graphene-based materials such as pure graphene films, interwoven-CNT films and exfoliated graphite papers). The carrier layer 16 has directly grown on upper and lower surfaces thereof a plurality of generally vertically extending the hollow nano-tubes 18 here using microwave plasma chemical vapor deposition or thermal chemical vapor deposition.

Figure 2A:
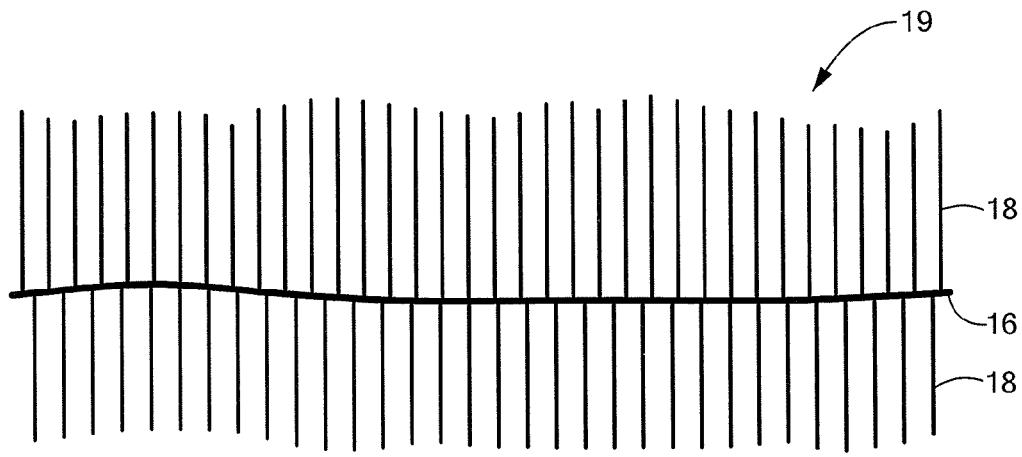
FIGS. 2A shows a sketch of the structure of FIG. 1 at one stage in the fabrication thereof.
Figure 2B:
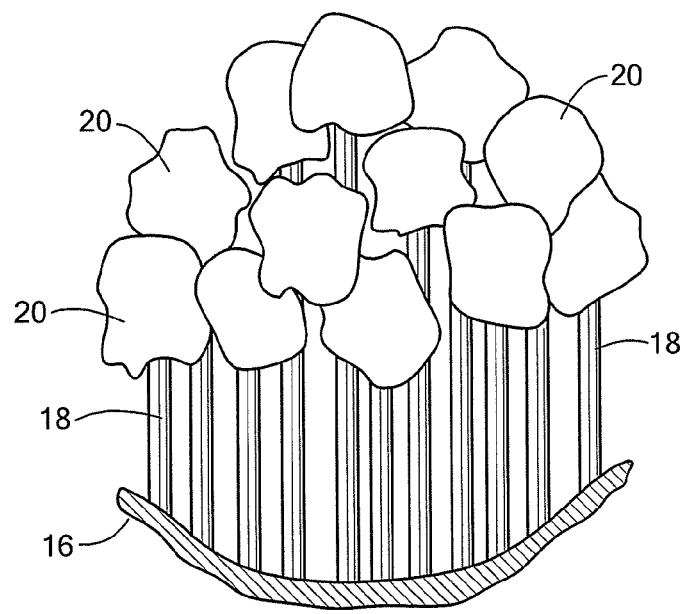
FIG. 2B shows a sketch of the structure of FIG. 1 at later stage in the fabrication thereof.

The nano-tubes 18 and carrier layer 16 provide an interposer structure 19, shown more clearly in FIG. 2A. The nano-tubes 18 are formed with proximal ends disposed on the carrier layer 16 and with a plurality of heat conductive tips 20, here electron beam evaporated metals, such as layered Ti/Au or W/Au for example, disposed on distal ends of the nano-tubes 18, as shown more clearly in FIG. 2B. Here the nano-tubes 18 are Carbon Nano-Tubes (CNT). The heterogeneous interfaces between the nano-tubes and carrier structure are engineered to minimize thermal resistance across the boundary through manipulation of nano-tube contact geometry and/or modification of nano-tube material properties.

The CNT 18 synthesis on foils 16 provides the following critical benefits:
  Inherently reworkable, because the CNTs 18 are grown directly on the interposer carrier 16 (metallic and graphene-based) foils; and the assembly 19 can be removed and reinserted to the same heat sink.
  High shear strength and thermal conductance at the CNT film/substrate interface due to the chemical bonds formed during direct synthesis.
  Very low application times, since foils and graphene interposer materials are fabricated separately from the device, and quickly assembled between the heat sink and semiconductor using low temperatures and pressures.
  Following fabrication of CNTs 18 on the interposer carrier 16, as shown in FIG. 2A, the ends of the CNTs 18 are metalized with very thin layers, for example, 30/1000 nm Ti/Au or W/Au, tips 20 (FIG. 2B), as noted above, using electron beam evaporation. Thermo-compression bonding is performed allowing these tips to react with the substrates (i.e., the heat source 12 and heat sink 14, FIG. 1) such as a III-V semiconductor or CuMo alloy, thereby forming a thin but effective bond across the CNT-substrate interface.

More particularly, metallic bonding approach solves another challenge that has plagued traditional CNT TIM approaches: high interface resistance at the attachment surfaces. Here, CNT tips are used that form stable metallic bonds to conventional semiconductor die and heat spreader metallizations.

Examples of metals used for the tips 20 include Ti/Au, for bonding CNTs to metallized SiC and CuMo alloy surfaces. The aforementioned material systems can be processed at temperatures below 170° C. and are inherently stable to provide a reduction in interface resistance and long term stability of mechanical and thermal properties. The approach addresses: 1) thermal resistance through reduction of the CNT free-end contact resistance, 2) rework and processing temperature through low-temperature thermal-compression bonding of a free-standing CNT-foil interposer structure and 3) stability and temperature cycles through the use of inherently stable homogeneous thin metallic bonding layers.

Figure 3A:
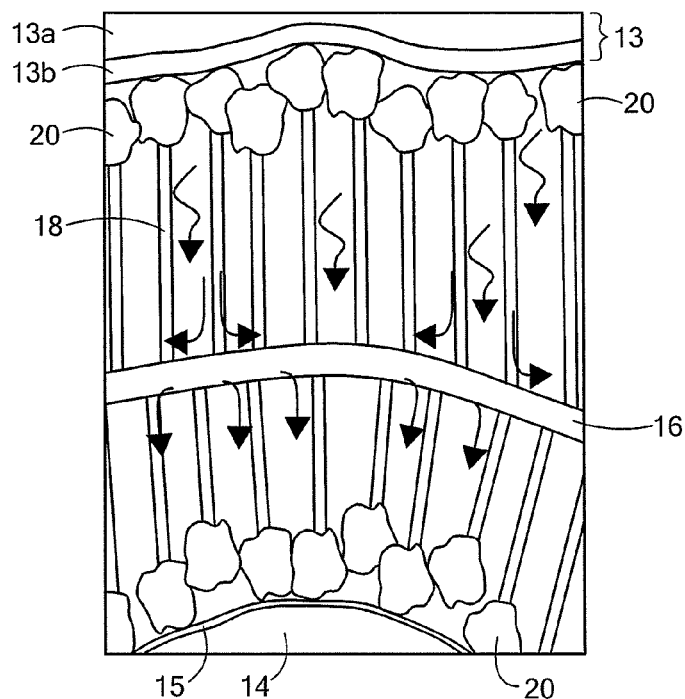
FIGS. 3A, 3B and 3C are sketches of various indicated enlarged upper and lower portions, respectively, of the structure of FIG. 1.
Figure 3C:
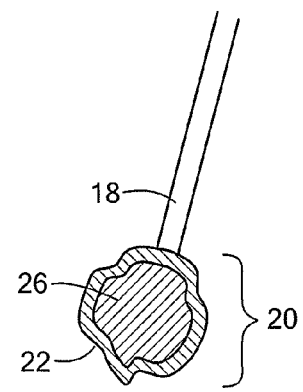
Figure 3B:
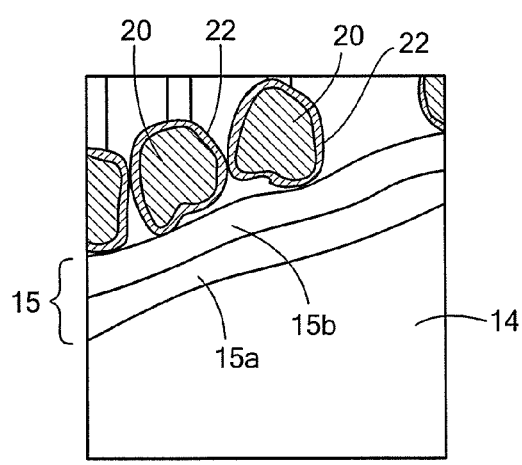

Next, as shown in FIGS. 3A and 3B, the structure (i.e., the interposer 19, FIG. 2A with the tips 20 (FIG. 2B) containing an adhesion layer 26, here for example, W or Ti, surrounded by a bonding layer 22, here, for example Au (FIGS. 3A and 3B) are held together in a sandwiched structure and are the coated upper tips 20 are thermo-compression bonded to layer 13 simultaneously as the lower coated tips 20 are bonded to the layer 15 having an adhesive metallic layer 15a and a bonding layer 15b. The thermo-compression bonding process uses a low processing temperature and pressure (e.g., less than 170 degrees centigrade and 30 psi) so not to disturb the semiconductor device. Here, the bonding is with a similar metallization inherent to the device and heat sink comprised to of an adhesive metallic layer 15a such as W or Ti and the bonding layer 15b such as Au.

The thermo-compression bonding may be performed by heating the sandwich structure in a furnace and applying pressure to the MMIC 12 and the heat sink 14 with a vice or clamp, etc. or, by applying heat on top of the MMIC 12 and the bottom of the heat sink 14 while relying on conduction of heat to the bonded interface. In any event, there is a physical bond between the upper portion of the tips 20 and the layer 13 and between the bottom portion of the tips 20 and the layer 15.

The resulting structure shown in FIG. 1 provides a thermal path for heat generated in the MMIC 12 to pass to the heat sink 14 as shown by the arrows in FIG. 3A and also provided an electrical path between the ground plane layer 13 and the electrically conductive heat sink 14. Thus, by grounding the heat sink 14, the MMIC 12 ground plane layer 13 also becomes grounded.

A number of embodiments of the disclosure have been described. Nevertheless, it will be understood that various modifications may be made without departing from the spirit and scope of the disclosure. Accordingly, other embodiments are within the scope of the following claims.

What is claimed is:
1. A method for forming a structure, comprising:
  providing a semiconductor structure having an electrically and thermally conductive layer disposed on one surface of the semiconductor structure;
  providing an electrically and thermally conductive heat sink;
  providing a unit comprising:
    a electrically and thermally conductive carrier layer;
    a plurality of electrically and thermally conductive nano-tubes, a first portion of the plurality of nano-tubes having proximal ends disposed on a first surface of the carrier layer and a second portion of the plurality of nano-tubes having proximal ends disposed on an opposite surface of the carrier layer;
    a plurality of heat conductive tips disposed on distal ends of the plurality of nano-tubes, the tips having an adhesive material with a bonding material coating the adhesive material;
  providing a sandwich structure comprising the provided unit disposed between the provided heat sink and provided semiconductor structure with the plurality of heat conductive tips on the first portion of the plurality of nano-tubes positioned in contact with the conductive layer and with the plurality of heat conductive tips on the second portion of the plurality of nano-tubes being positioned in contact with the heat sink;
  applying heat to the sandwich structure to simultaneously bond: (1) the plurality of heat conductive tips on the first portion of the plurality of nano-tubes to the conductive layer; and (2) the plurality of heat conductive tips on the second portion of the plurality of nano-tubes to the heat sink; and
  wherein the tips on the distal ends of the first portion of the plurality of nano-tubes are thermo-compression bonded to the conductive layer simultaneously as the tips of the second portion of the plurality of nano-tubes are thermo-compression bonded to the heat sink.

2. A method for forming a structure, comprising:
  providing a semiconductor structure having an electrically and thermally conductive layer disposed on one surface of the semiconductor structure;
  providing an electrically and thermally conductive heat sink;

providing a unit comprising:
- a electrically and thermally conductive carrier layer; a plurality of electrically and thermally conductive nano-tubes, a first portion of the plurality of nano-tubes having proximal ends disposed on a first surface of the carrier layer and a second portion of the plurality of nano-tubes having proximal ends disposed on an opposite surface of the carrier layer;
- a plurality of heat conductive tips disposed on distal ends of the plurality of nano-tubes, wherein the tips are formed with an inner adhesion material coated with a bonding material;

providing a sandwich structure comprising the provided unit disposed between the provided heat sink and provided semiconductor structure with the plurality of heat conductive tips on the first portion of the plurality of nano-tubes positioned in contact with the conductive layer and with the plurality of heat conductive tips on the second portion of the plurality of nano-tubes being positioned in contact with the heat sink;

applying heat to the sandwich structure to simultaneously bond: (1) the plurality of heat conductive tips on the first portion of the plurality of nano-tubes to the conductive layer; and (2) the plurality of heat conductive tips on the second portion of the plurality of nano-tubes to the heat sink wherein the carrier layer is graphene.

3. The method recited in claim 1 wherein the carrier layer is graphene.

\* \* \* \* \*